United States Patent
Han et al.

(10) Patent No.: US 9,150,785 B2
(45) Date of Patent: Oct. 6, 2015

(54) RED FLUORESCENT MATERIALS AND PREPARATION METHODS THEREOF

(75) Inventors: Jianwei Han, Guangdong (CN); Xingren Liu, Guangdong (CN); Yuqing Tong, Guangdong (CN)

(73) Assignee: SHENZHEN POLYTECHNIC, Shenzhen, Guangdong (CN)

( * ) Notice: Subject to any disclaimer, the term of this patent is extended or adjusted under 35 U.S.C. 154(b) by 176 days.

(21) Appl. No.: 13/988,604

(22) PCT Filed: Dec. 11, 2010

(86) PCT No.: PCT/CN2010/079680
§ 371 (c)(1),
(2), (4) Date: May 21, 2013

(87) PCT Pub. No.: WO2012/071746
PCT Pub. Date: Jun. 7, 2012

(65) Prior Publication Data
US 2013/0244357 A1 Sep. 19, 2013

(30) Foreign Application Priority Data
Dec. 3, 2010 (CN) .......................... 2010 1 0572527

(51) Int. Cl.
| | | |
|---|---|---|
| *C09K 11/77* | (2006.01) | |
| *C09K 11/78* | (2006.01) | |
| *H05B 33/14* | (2006.01) | |
| *H01L 33/50* | (2010.01) | |

(52) U.S. Cl.
CPC ........... *C09K 11/7794* (2013.01); *C09K 11/774* (2013.01); *C09K 11/7736* (2013.01); *C09K 11/7797* (2013.01); *H05B 33/14* (2013.01); *H01L 33/502* (2013.01)

(58) Field of Classification Search
CPC ........... C09K 11/7794; C09K 11/7736; C09K 11/774; H01L 33/50
USPC ........... 252/301.5, 301.4 R, 301.4 H, 301.4 F, 252/301.4 P, 301.6 R, 301.6 F, 301.6 P; 313/503; 257/98
See application file for complete search history.

(56) References Cited

FOREIGN PATENT DOCUMENTS

| CN | 101457401 | * | 6/2009 |
|---|---|---|---|
| CN | 101457402 | * | 6/2009 |

OTHER PUBLICATIONS

Translation for CN 101457402—Jun. 17, 2009.*
Translation for CN 101456401—Jun. 17, 2009.*
Abstract for CN 101457401—Jun. 17, 2009.*

* cited by examiner

*Primary Examiner* — Carol M Koslow
(74) *Attorney, Agent, or Firm* — Jackson IPG PLLC; Damian K. Jackson (57) ABSTRACT

The invention provides a red fluorescent material of which the chemical formula is $(Li_{1-a-b}M^I_a M^{II}_{2b})_{2+m}(Gd_{1-x-y}Eu_x Ln_y)_{4-2b}(MoO_4)_{7-c-z}(WO_4)_c(A)_z$. The invention further provides a preparation method of the red fluorescent material, and an electric light source prepared from the red fluorescent material and a preparation method of the electric light source. The invention has the beneficial effect that the red fluorescent material uses $Eu^{3+}$ ions as the main activator; under the excitation of near ultraviolet light or blue light emitted by a semiconductor LED chip, the red fluorescent material has high light conversion efficiency, and emits light in a mode of red sharp lines of characteristic 4f electron-configuration $^5D_0 \rightarrow ^7F_2$ energy level transition of $Eu^{3+}$; and the red fluorescent material has high color purity, high emissive power and stable performance.

13 Claims, 5 Drawing Sheets

RED FLUORESCENT MATERIALS AND PREPARATION METHODS THEREOF

TECHNICAL FIELD OF THE INVENTION

The invention relates to the technical field of luminescent material, in particular to a red fluorescent material, and a preparation method thereof and an electric light source prepared therefrom.

BACKGROUND OF THE INVENTION

White LED solid lighting that rose in the early 21st century is commonly known as semiconductor lighting and has been developed rapidly due to such advantages as high light efficiency, good energy-saving property, no pollution, environmental protection, long service life, etc.

After years of efforts, white LED will be pushed into the area of general (indoor) lighting, general white LED bulb were commercially available from 2009 to 2012, and even straight-tube LED fluorescent lamps were also available on the market. They all need to meet the strict parameters in China Standard and U.S. Energy Star standard (which came into force on Aug. 31, 2010). In addition to light efficiency, LED's colorimetric parameters (color temperature, chromaticity coordinate, color rendering property) are particularly important. It is quite urgent to develop a white LED with different color temperature, high color rendering property and high light efficiency. At present, the demand on high-color-rendering lighting of LED cannot be met and achieved by traditional manufacturing of a white LED only through a YAG:Ce yellow fluorescent material, this is because this light source is under a shortage of red component and has low color rendering index. A top-quality red fluorescent material is needed for implementing the white LED regardless of use of a semiconductor blue light LED chip or use of combination of a near ultraviolet light LED chip and a photoconversion fluorescent material.

In summary of various fluorescent materials that can be used for white LED (p 321-329 in *Luminescence and Luminescent Materials* edited by X U, Xurong, S U, Mianzeng, published on October 2004, Chemical Industry Press), LIU, Xingren indicates that, there is particularly a shortage of red fluorescent material with excellent performances at present.

To improve the color rendering index (Ra) of white LED, $Ce^{3+}$ and $Pr^{3+}$ co-excited YAG (See P326 in *Luminescence and Luminescent Materials*; H. S. Jang, et al, J. Lumin. 2007, 126: 126) and TAG:Ce(Tb$_3$Al$_5$O$_{12}$:Ce) fluorescent material (See A. A. Setlur et al, Proc. of SPIE, 2004, Vol. 5187: 142; M. Nazarov et al, J. Solid State Chem, 2007, 180: 2493) have been acquired by research on the basis of YAG:Ce yellow powder. The former is characterized by superposition of a weaker 611 nm ($Pr^{3+}$) red emission line on the emission spectrum of $Ce^{3+}$, and the latter is characterized by little movement of the emission spectrum of $Ce^{3+}$ towards long wave. These measures aim at increasing the red component a little in the emission spectrum of $Ce^{3+}$, which contributes to improving the color rendering index Ra of LED. However, this scheme is at the cost of brightness reduction, furthermore, improvement of the color rendering index Ra is quite limited and cannot meet the demands of a white LED with high color rendering property and medium/low color temperature. The (Ca, Sr)S:$Eu^{2+}$ red fluorescent material can be effectively excited by a blue light LED to emit fresh red light and can be used in a white LED with high color rendering property, but such an alkaline earth sulfide that is very poor in chemical stability absorbs moisture and is decomposed to generate toxic hydrogen sulfide gas, thereby blackening and damaging the fluorescent material. In addition, this fluorescent material cannot be used in a near ultraviolet light (NUV) white LED due to its low NUV excitation efficiency.

It has also been proposed that the well-known $Y_2O_3$:Bi, Eu fluorescent material is used as a red material for NUV white LED (U.S. Pat. No. 6,255,670B1), so does the $Y_2O_2S$:Eu red fluorescent material for television (Taguchi Tsunemasa et al, J. Lingt, Vis. Env. 2003, 27(3):131), however, they have a common problem of low luminous efficiency under the excitation of NUV (390-410 nm) and blue light.

Recently, $Eu^{2+}$-excited nitride and nitrogen oxide red fluorescent materials have been successfully developed to bring excellent effect, such as $MSi_5N_8$:Eu(M:Ca, Sr, Ba), $CaAlSiN_3$:$Eu^{2+}$ and the like. But these red fluorescent materials are unstable in the air above 200° C., and special, inaccessible and dangerous raw materials as well as a high-temperature (1600-2000° C.) high-pressure special synthesis method are needed in preparation of such red fluorescent materials, which imposes a limitation to their development. Moreover, such nitrogen oxide fluorescent materials are extremely expensive, which restricts their application in white LED.

SUMMARY OF THE INVENTION

An objective of the invention is to provide an efficient red fluorescent material, which uses $Eu^{3+}$ ions as the main activator, which has high light conversion efficiency under the excitation of near ultraviolet light or blue light emitted by a semiconductor LED chip and emits light in a mode of red sharp lines of characteristic 4f electron-configuration $^5D_0 \rightarrow ^7F_2$ energy level transition of Eu<3+>, and which has high color purity, high emissive power and stable performance.

Another objective of the invention is to provide a preparation method of the efficient red fluorescent material, which is simple in steps, low in preparation temperature (lower than 1000° C.), easy in acquisition of raw materials and low in price.

Another objective of the invention is to provide an electric light source prepared from the above red fluorescent material.

Another objective of the invention is to provide a method for preparing the electric light source from the above red fluorescent material.

A red fluorescent material, characterized in that: the chemical formula of the red fluorescent material is:

$(Li_{1-a-b}M^I_a M^{II}_{2b})_{2+m}(Gd_{1-x-y}Eu_x Ln_y)_{4-2b}(MoO_4)_{7-c-z}(WO_4)_c(A)_z;$ $M^I$ is one or more of the group consisting of Ag, Na, K, Rb and Cs;

$M^{II}$ is one or more of the group consisting of Be, Mg, Ca, Sr, Ba, Zn, Mn, Pb, Cd and Cu;

Ln is one or more of the group consisting of Bi, Al, Ga, In, Sc, Y, La, Ce, Pr, Nd, Sm, Tb, Dy, Ho, Er, Tm, Yb and Lu;

A is a group formed by bonding of oxygen with one or more of the group consisting of B, Si, Ge, Ti, Zr, Hf, V, Nb, Ta and P or a halogen anion;

$0 \le a \le 1$, $0 \le b \le 1$, $0 \le a+b \le 1$, $0 \le c \le 7$, $0 \le z \le 2$, $0 \le c+z \le 7$, $0 < x \le 1$, $0 \le y \le 0.5$, $0 < x+y \le 1$, and m=z when A is the group formed by bonding of oxygen with one or more of the group consisting of B, Si, Ge, Ti, Zr, Hf, V, Nb, Ta and P; and m=−z when A is the halogen anion.

In accordance with luminescence and crystal field theory, there are a few 4f-4f energy level transitions of $Eu^{3+}$, i.e. $^7F_0$-$^5G_6$, $^7F_0$-$^5G_2$, $^7F_0$-$^5L_6$ and $^7F_0$-$^5D_2$, because $Eu^{3+}$ ions are just within a 370-400 nm near ultraviolet light region and a 465 nm blue light region. They have strong absorption characteristics, these energy levels are exactly matched with and can be effectively excited by LEDs emitting near ultraviolet light and blue light. In addition, the $Eu^{3+}$ ions are located at an asymmetric center lattice site in crystal and mainly generate $^5D_0$-$^5F_0$ energy level forced electric dipole transition to emit strong red fluorescent light.

Rare earth ions and $Eu^{3+}$ ions are co-doped, for example, an $Sm^{3+}$ and $Eu^{3+}$-co-doped fluorescent material is absorbed and extended in a near ultraviolet light region, and non-absorption empty regions near 400-410 nm are filled with $Sm^{3+}$ absorption ($^6H_{15/2} \rightarrow {}^4L_{13/2}$) to result in better matching property with an InGaN near ultraviolet light emission spectrum. Emission of reddish-orange light is also generated after excitation of $Sm^{3+}$ ions. Thus, their excitation and emission efficiencies are improved.

Similar to the same principle, $Tb^{3+}$, $Tm^{3+}$ and $Dy^{3+}$ can be excited by 360-390 nm near ultraviolet light to emit 544 nm green light, 456 nm blue light and 575 nm-near yellow light, respectively, thus leading to abundant emission spectra in the visible light region of LED and improving color rendering of LED light source. $Pr^{3+}$ ions having similar properties as well can be excited by blue light to generate $^1D_2 \rightarrow {}^3H_4$ energy level transition and emit red light of about 610 nm.

The $Eu^{3+}$ doping concentration, or the concentration for substituting $Gd^{3+}$, in $Eu^{3+}$ rare earth molybdate red fluorescent material of the invention can be quite high, and even, $Gd^{3+}$ is completely substituted to increase the absorption density of $Eu^{3+}$, increase the electron return ground state density, reduce the loss of excitation energy and keep high luminous intensity. They have high emission color purities under the excitation of near ultraviolet light (370-410 nm) and 464-467 nm blue light, and even the excitation of 536 nm green light, and the emission peak with high emissive power is 615 nm red light. In addition, a large amount of cation vacancies are present in such luminescent materials, which is as high as 14.3%, so $Eu^{3+}$—$Eu^{3+}$ ions are increased in spacing, interaction is weakened, the possibility of non-radiation energy transmission is reduced, and accordingly, the quenching concentration may be quite high.

Preferably, $M^I$ is Na; $M^{II}$ is one of the group consisting of Ca and Mg; Ln is one of the group consisting of Sm, Bi, La, Y, Tb, Tm, Dy and Pr.

More preferably, A is $(BO_3)^{3-}$ or a halogen anion.

More preferably, the halogen anion is $F^-$.

In the molybdate fluorescent material of the invention, Li lattice site accounts for 28.6%, Gd(Eu) lattice site accounts for 57.1%, and cation vacancy Φ accounts for 14.3%. They are random in mixing and occupation and have a disorder microstructure. Substitution of $(MoO_4)^{2-}$ by $(BO_3)^{3-}$ and $F^-$ moieties aggravates the disorder degree in structure, so that the Eu center is located within a microenvironment that is not completely identical, influence from an external crystal field is different to a certain extent, the energy level of $Eu^{3+}$ creates a small difference, the transition energy is not completely unitary, and the range of distribution is increased, thus causing that inhomogeneous broadening is generated by excitation (absorption) and emission spectrum lines of $Eu^{3+}$.

The presence of $BO_3^{3-}$ and $F^-$ can achieve partial substitution of $(MoO_4)^{2-}$ to generate an $Eu^{3+}$-excited molybdate red fluorescent material that contains borate $(BO_3)^{3-}$ or $F^-$, e.g. $Li_{2+x}(Gd_{1-y}Eu_y)_4(MoO_4)_{7-x}(BO_3)_x$ and $Li_{2-x}(Gd_{1-y}Eu_y)_4(MoO_4)_{7-x}F_x$. Their absorption and excitation efficiencies are greatly improved so as to improve the emissive power of $Eu^{3+}$. This is because $(MoO_4)^{2-}$ group is modified by $(BO_3)^{3-}$ group and $F^-$ anion.

Another importation function derived from partial substitution of $(MoO_4)^{2-}$ group by $(BO_3)^{3-}$ group and F anion is that, inhomogeneous broadening of higher 4f energy levels of $Eu^{3+}$ occurs, e.g. $^5D_4$, $^5L_6$, $^5D_3$, $^5D_2$ and $^5D_1$ energy levels, so that the excitation (absorption) spectrum lines of these energy levels are widened to improve their excitation efficiencies remarkably.

More preferably in any aforementioned scheme, $0.3 \le x \le 1.0$.

More preferably in any aforementioned scheme, a=0.

A preparation method of the red fluorescent material, the chemical formula of the red fluorescent material is:

$(Li_{1-a-b}M^I_a M^{II}_{2b})_{2+m}(Gd_{1-x-y}Eu_x Ln_y)_{4-2b}(MoO_4)_{7-c-z}(WO_4)_c(A)_z$;

$M^I$ is one or more of the group consisting of Ag, Na, K, Rb and Cs;

$M^{II}$ is one or more of the group consisting of Be, Mg, Ca, Sr, Ba, Zn, Mn, Pb, Cd and Cu;

Ln is one or more of the group consisting of Bi, Al, Ga, In, Sc, Y, La, Ce, Pr, Nd, Sm, Tb, Dy, Ho, Er, Tm, Yb and Lu;

A is a group formed by bonding of oxygen with one or more of the group consisting of B, Si, Ge, Ti, Zr, Hf, V, Nb, Ta and P or a halogen anion;

$0 \le a \le 1$, $0 \le b \le 1$, $0 \le a+b \le 1$, $0 \le c \le 7$, $0 \le z \le 2$, $0 \le c+z \le 7$, $0 < x \le$, $0 \le y \le 0.5$, $0 < x+y \le 1$, and m=z when A is the group formed by bonding of oxygen with one or more of the group consisting of B, Si, Ge, Ti, Zr, Hf, V, Nb, Ta and P; and m=−z when A is the halogen anion;

characterized in that, the method comprises the following steps of:

① taking metals or compounds of Li, Mo and W and compounds of Eu, Gd, $M^I$, $M^{II}$, Ln and A as raw materials, weighing corresponding raw materials in accordance with the molar mixture ratio as required by the chemical formula, and grinding and uniformly mixing the raw materials to obtain a mixture;

② burning the mixture obtained from the step ① for 0.5 to 10 hours at 750-1000° C. to obtain the red fluorescent material.

Preferably, A is $(BO_3)^{3-}$ or a halogen anion.

More preferably, the halogen anion is F.

More preferably, distilled water and/or volatile organic solvent is added in the grinding process of the step ①, and the volatile organic solvent is one or the mixture of acetone and ethanol.

More preferably in any aforementioned preparation scheme of the red fluorescent material, an extra post-treatment process is carried out subsequent to the step ②, and includes crushing, impurity removal, drying and classification.

The impurity removal process includes one or more of the group consisting of acid cleaning, alkaline cleaning and water cleaning.

The classification process includes one or more of the group consisting of sedimentation, screening, hydraulic classification and airflow classification.

More preferably in any aforementioned preparation scheme of the red fluorescent material, a pre-burning step is carried out before the mixture obtained from the step ① is burned for 0.5 to 10 hours at 750-1000° C., and the pre-burning step is that the mixture obtained from the step ① is pre-burned for 0.5 to 3 hours in the air and then ground and uniformly mixed after pre-burning.

More preferably, the burning time in the step ② is 1.5 to 4 hours.

In the event that $CeO_2$, $Pr_6O_{11}$ or $Tb_4O_7$ are included in the raw materials of the red fluorescent material, a small amount of metal Mo or W can be mixed during preparation to reduce $Ce^{4+}$, $Pr^{4+}$ and $Tb^{4+}$ be trivalent, thus the effect of reducing agent is acquired.

The red fluorescent material in any aforementioned scheme can be used not only as the red fluorescent material in a three-primary color white LED formed by near ultraviolet light (370-410 nm), but also as the red fluorescent material in a white LED with high color rendering property formed by a traditional InGaN blue light LED chip and a photoconversion fluorescent material. They have high emission color purities and high emissive powers under the excitation of long-wave ultraviolet light, near ultraviolet light and blue light, and their emission peaks are 615 nm. By combining this red fluorescent material with other fluorescent materials, a white LED with high brightness and high color rendering property can be prepared using a near ultraviolet light or blue light LED chip scheme.

An electric light source includes the red fluorescent material, and the chemical formula of the red fluorescent material is:

$M^I$ is one or more of the group consisting of Ag, Na, K, Rb and Cs;

$M^{II}$ is one or more of the group consisting of Be, Mg, Ca, Sr, Ba, Zn, Mn, Pb, Cd and Cu;

Ln is one or more of the group consisting of Bi, Al, Ga, In, Sc, Y, La, Ce, Pr, Nd, Sm, Tb, Dy, Ho, Er, Tm, Yb and Lu;

A is a group formed by bonding of oxygen with one or more of the group consisting of B, Si, Ge, Ti, Zr, Hf, V, Nb, Ta and P or a halogen anion;

$0 \le a \le 1$, $0 \le b \le 1$, $0 \le a+b \le 1$, $0 \le c \le 7$, $0 \le z \le 2$, $0 \le c+z \le 7$, $0 < x \le 1$, $0 \le y \le 0.5$, $0 < x+y \le 1$, and m=z when A is the group formed by bonding of oxygen with one or more of the group consisting of B, Si, Ge, Ti, Zr, Hf, V, Nb, Ta and P; and m=−z when A is the halogen anion.

A preparation method of the electric light source comprises the steps that:

the red fluorescent material is mixed with blue and green fluorescent materials that can be excited by 370-410 nm near ultraviolet light, then the mixture is combined with package resin and coated on a semiconductor chip capable of emitting near ultraviolet light, to obtain a white LED electric light source.

The chemical formula of the red fluorescent material is:

$M^I$ is one or more of the group consisting of Ag, Na, K, Rb and Cs;

$M^{II}$ is one or more of the group consisting of Be, Mg, Ca, Sr, Ba, Zn, Mn, Pb, Cd and Cu;

Ln is one or more of the group consisting of Bi, Al, Ga, In, Sc, Y, La, Ce, Pr, Nd, Sm, Tb, Dy, Ho, Er, Tm, Yb and Lu;

A is a group formed by bonding of oxygen with one or more of the group consisting of B, Si, Ge, Ti, Zr, Hf, V, Nb, Ta and P or a halogen anion;

$0 \le a \le 1$, $0 \le b \le 1$, $0 \le a+b \le 1$, $0 \le c \le 7$, $0 \le z \le 2$, $0 \le c+z \le 7$, $0 < x \le 1$, $0 \le y \le 0.5$, $0 < x+y \le 1$, and m=z when A is the group formed by bonding of oxygen with one or more of the group consisting of B, Si, Ge, Ti, Zr, Hf, V, Nb, Ta and P; and m=−z when A is the halogen anion.

The red fluorescent material can be mixed, in any proportion, with blue and green fluorescent materials that can be excited by 370-410 nm near ultraviolet light.

The package resin preferably is epoxy resin or silicone adhesive.

A preparation method of the electric light source comprises the steps that: the red fluorescent material is mixed with yellow and/or yellow-green fluorescent material that can be excited by blue light, then the mixture is combined with package resin and coated on an LED chip capable of emitting 460-470 nm blue light, to obtain a white LED electric light source.

The chemical formula of the red fluorescent material is:

$M^I$ is one or more of the group consisting of Ag, Na, K, Rb and Cs;

$M^{II}$ is one or more of the group consisting of Be, Mg, Ca, Sr, Ba, Zn, Mn, Pb, Cd and Cu;

Ln is one or more of the group consisting of Bi, Al, Ga, In, Sc, Y, La, Ce, Pr, Nd, Sm, Tb, Dy, Ho, Er, Tm, Yb and Lu;

A is a group formed by bonding of oxygen with one or more of the group consisting of B, Si, Ge, Ti, Zr, Hf, V, Nb, Ta and P or a halogen anion;

$0 \le a \le 1$, $0 \le b \le 1$, $0 \le a+b \le 1$, $0 \le c \le 7$, $0 \le z \le 2$, $0 \le c+z \le 7$, $0 < x \le 1$, $0 \le y \le 0.5$, $0 < x+y \le 1$, and m=z when A is the group formed by bonding of oxygen with one or more of the group consisting of B, Si, Ge, Ti, Zr, Hf, V, Nb, Ta and P; and m=−z when A is the halogen anion.

The red fluorescent material can be mixed, in any proportion, with blue and green fluorescent materials that can be excited by 370-410 nm near ultraviolet light.

The package resin preferably is epoxy resin or silicone adhesive.

Preferably, the LED chip is an LED chip that emits 464-467 nm blue light.

Compared with the prior art, the invention has the beneficial effect that: the red fluorescent material provided by the invention, under the excitation of near ultraviolet light or blue light emitted by a semiconductor LED chip, has high light conversion efficiency, and emits light in a mode of red sharp lines of characteristic 4f electron-configuration $^5D_0 \rightarrow {}^7F_2$ energy level transition of $Eu^{3+}$; and the red fluorescent material has high color purity, high emissive power and stable performance. The preparation method of the red fluorescent material provided by the invention is simple in steps, low in preparation temperature (lower than 1000° C.), easy in acquisition of raw materials and low in price. The electric light source provided by the invention has high brightness and high color rendering property.

DETAILED DESCRIPTION OF THE EMBODIMENTS

Further description is made below to the invention with reference to the accompanying drawings and the embodiments.

Embodiment 1

$Li_2(Gd_{0.5}Eu_{0.5})_4(MoO_4)_7$ 0.2932 g $Li_2CO_3$, 1.439 g $Gd_2O_3$, 1.3972 g $Eu_2O_3$ and 4.000 g $MoO_3$ are weighed and uniformly ground and mixed in a mortar, the mixture is then put in a corundum crucible, and the corundum crucible is topped and put in a box-type high temperature furnace. The mixture is pre-burned for 1.5 hours at a low temperature of 500° C. at first, then taken out for uniform grinding and mixing and put back in the previous corundum crucible, the corundum crucible is topped and put in the box-type high temperature furnace, the temperature is raised to 800° C. and kept for 2 hours, the mixture is taken out and then cooled to obtain a $Li_2(Gd_{0.5}Eu_{0.5})_4(MoO_4)_7$ red fluorescent material having a light pink-white color.

Figure 1:
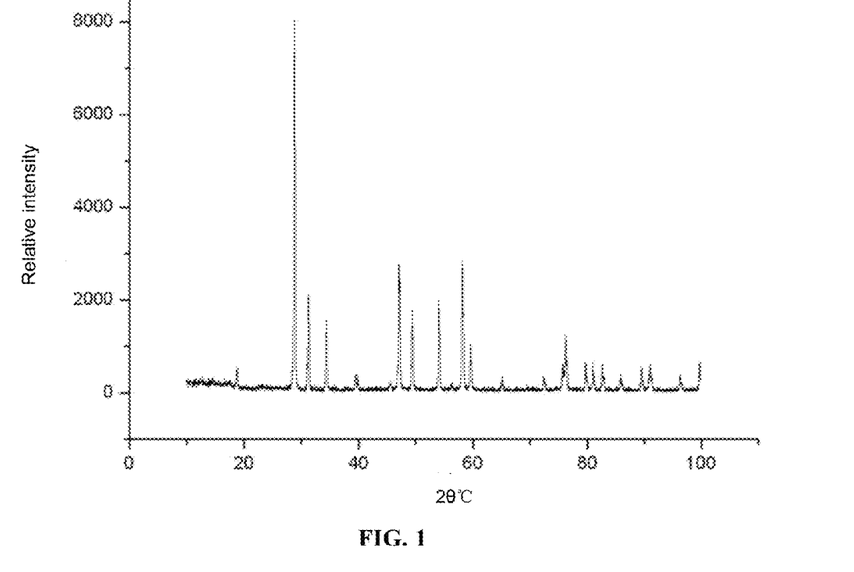
FIG. 1 is an X-ray diffraction pattern of $Li_2(Gd_{0.5}Eu_{0.5})_4(MoO_4)_7$.

Its x-ray diffraction pattern, as shown in FIG. 1, is of a tetragonal system structure, which is identical to $Na_{0.5}Gd_{0.5}MoO_4$(JCPDS25-0828) and $CaWO_4$(JCPDS41-1431) both having a scheelite structure. The strongest diffraction peak $2\theta(112)$=28.84 degrees. The red fluorescent material emits bright red light and pink light under 254 nm and 365 nm ultraviolet lamps, and emits red light under the excitation of 395 nm and 469 nm LEDs.

Figure 2:
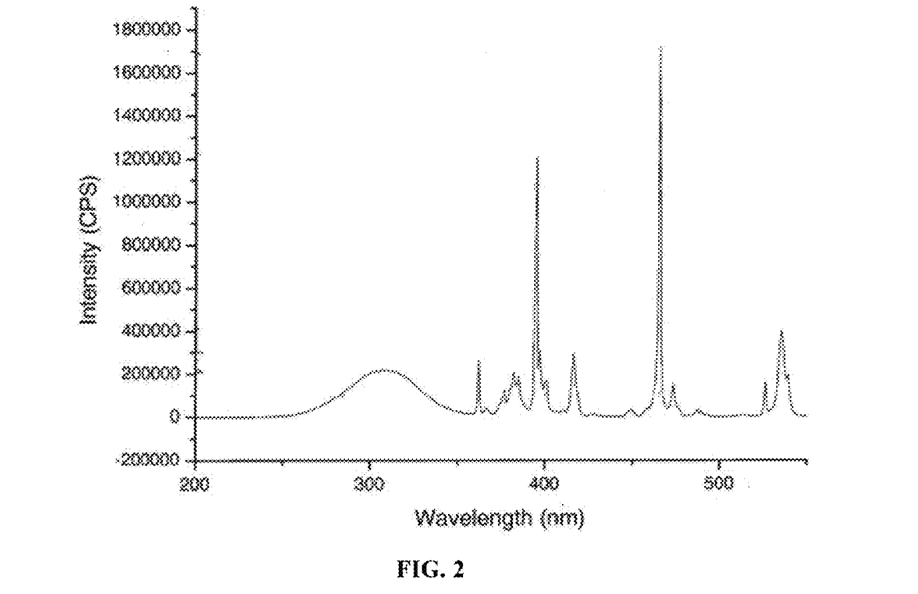
FIG. 2 illustrates an excitation spectrum of $Li_2(Gd_{0.5}Eu_{0.5})_4(MoO_4)_7$, $\lambda_{em}=615$ nm.
Figure 3:
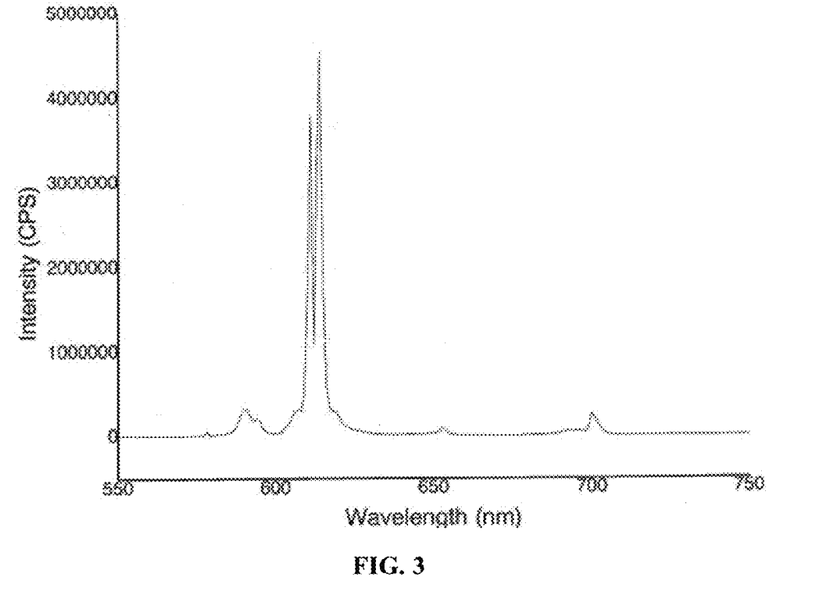
FIG. 3 illustrates an emission spectrum of the $Li_2(Gd_{0.5}Eu_{0.5})_4(MoO_4)_7$ fluorescent material under 465 nm excitation.
Figure 4:
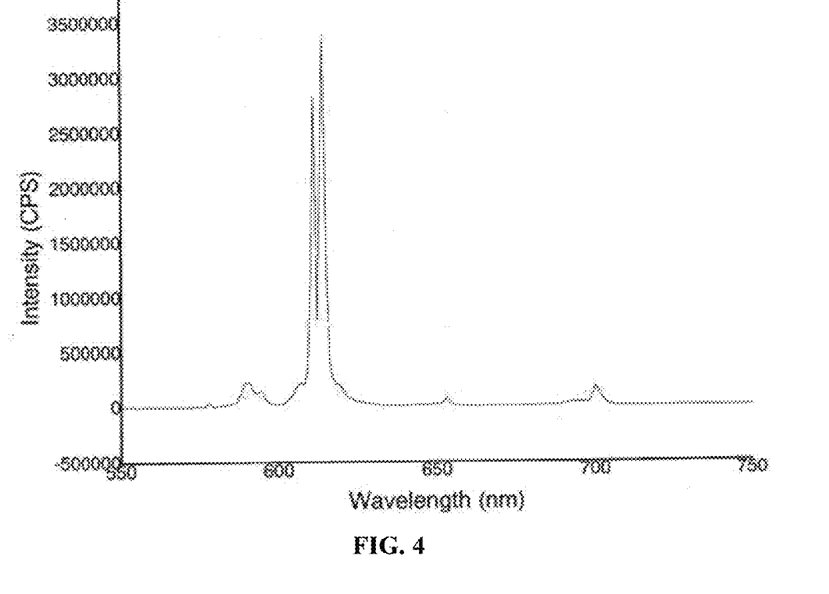
FIG. 4 illustrates an emission spectrum of the $Li_2(Gd_{0.5}Eu_{0.5})_4(MoO_4)_7$ fluorescent material under 395 nm excitation.

The excitation spectrum of the sample is tested by Fluorolog 3-22 type fluorescence spectrometry. FIG. 2 illustrates an excitation spectrum monitored by a 615 emission line of $Eu^{3+}$ ions of $Li_2(Gd_{0.5}Eu_{0.5})_4(MoO_4)_7$. This excitation spectrum is mainly composed of $^5L_6$(395 nm), $^5D_2$(465 nm) and $^5D_1$(535 nm) sharp lines of higher 4f energy levels of $Eu^{3+}$ and a broad charge transfer band at higher energy. The excitation effects of 465 nm and 395 nm are extremely superior, which is regarded as a basis for use of the molybdate as the red fluorescent material in a solid lighting white LED light source. The emission spectra of this molybdate red fluorescent material under the excitation of 465 nm blue light and 395 nm near ultraviolet light are represented in FIG. 3 and FIG. 4 respectively. These two emission spectra are the same, have an emission peak of 615 nm and derive from $^5D_0 \rightarrow ^7F_2$ energy level transition emission of $Eu^{3+}$ ions.

Figure 5:
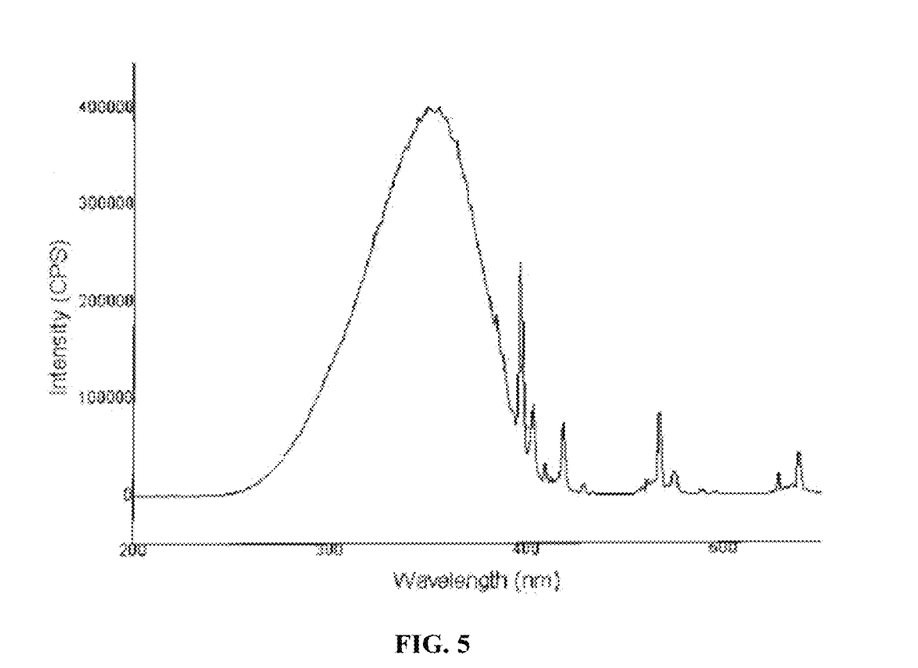
FIG. 5 illustrates an excitation spectrum of $Y_2O_2S$:Eu red fluorescent material for television, $\lambda_{em}=626$ nm.

FIG. 5 illustrates an excitation spectrum emitted by a comparison sample at 626 nm, i.e. a commercial television $Y_2O_2S$:Eu red fluorescent material, and compared with FIG. 1 in the invention, the charge transfer band (CTB) in FIG. 5 is quite strong, and the excitation efficiencies of 4f energy level excitation spectrum lines of $Eu^{3+}$ in near ultraviolet light and blue light spectrum regions are quite low.

Embodiment 2

Figure 6:
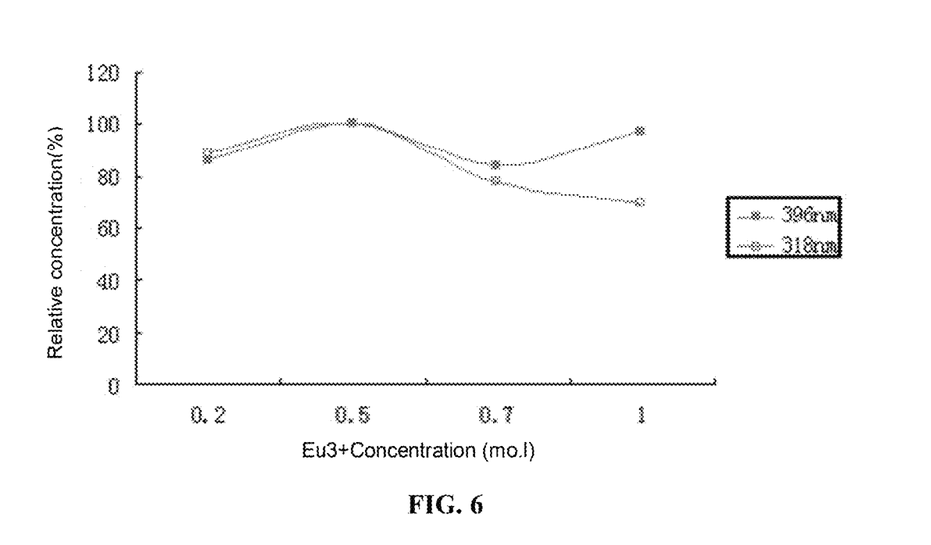
FIG. 6 illustrates the relationship between $Eu^{3+}$ concentration x(mol) and 615 nm emissive power in $Li_2(Gd_{1-x}Eu_x)_4(MoO_4)_7$.

Relationship Between Eu3+ Concentration and 615 nm Emissive Power in $Li_2(Gd_{1-x}Eu_x)_4(MoO_4)_7$ Samples with different doping concentrations are synthesized according to the method in the embodiment 1, and the relationships between their 615 nm emissive power changes and Eu3+ concentrations under the excitation of 396 nm and 318 nm (CTB) are measured respectively, as shown in FIG. 6. The optimal concentration range of Eu3+ is from 0.4 mol to 0.6 mol, and the same result is also acquired under the excitation of 465 nm.

Embodiment 3

$Li_{2.1}(Gd_{0.5}Eu_{0.5})_4(MoO_4)_{6.9}(BO_3)_{0.1}$ 0.2232 g $Li_2CO_3$, 1.095 g $Gd_2O_3$, 1.0629 g $Eu_2O_3$, 3.000 g $MoO_3$ and 0.0187 g $H_3BO_3$ are weighed and put in an agate mortar, a proper amount of acetone is added to the agate mortar and uniformly ground and mixed, the mixture is put in a corundum crucible, the corundum crucible is topped and put in a box-type high temperature furnace for burning for 2 hours at 800° C., and the mixture is taken out, impurity-removed by water cleaning and finally dried to obtain a product $Li_{2.1}(Gd_{0.5}Eu_{0.5})_4(MoO_4)_{6.9}(BO_3)_{0.1}$ red fluorescent material, which emits red light having an emission peak of 615 nm under the excitation of 395 nm and 465 nm. Its 615 nm emissive power is 1.25 times as much as that in the embodiment 1.

Embodiment 4

$(Li_{0.7}Na_{0.3})_2(Gd_{0.5}Eu_{0.5})_4(MoO_4)_7$ 0.154 g $LiCO_3$, 0.095 g $Na_2CO_3$, 1.079 g $Gd_2O_3$, 1.048 g $Eu_2O_3$ and 3.000 g $MoO_3$ are weighed and put in a mortar for uniform mixing and grinding, the uniformly-ground mixture is put in a crucible, the crucible is topped and put in a high temperature furnace for burning for 2 hours at 800° C. The resultant product is a $(Li_{0.7}Na_{0.3})_2(Gd_{0.5}Eu_{0.5})_4(MoO_4)_7$ red fluorescent material. Its crystalline structure and luminescence property are the same as those in the embodiment 1, and this red fluorescent material emits red light having an emission peak of 615 nm under the excitation of 395 nm near ultraviolet light and 465 nm blue light.

Embodiment 5

$Li_{2.6}Eu_4(MoO_4)_{6.4}(BO_3)_{0.6}$ 0.280 g $Li_2CO_3$, 2.223 g $Eu_2O_3$, 3.000 g $MoO_3$ and 0.078 g $H_3BO_3$ are weighed and put in a mortar, a proper amount of absolute ethyl alcohol is added to the mortar and uniformly ground and mixed, the mixture is put in an alumina crucible and pre-burned for 2 hours at a low temperature of 500° C. at first, then the mixture is taken out, uniformly ground and mixed and put back in the previous alumina crucible, the alumina crucible is topped and put in a high temperature furnace, the temperature is raised to 800° C. and kept for 2 hours, the mixture is taken out and then cooled to obtain a $Li_{2.6}Eu_4(MoO_4)_{6.4}(BO_3)_{0.6}$ red fluorescent material.

Figure 7:
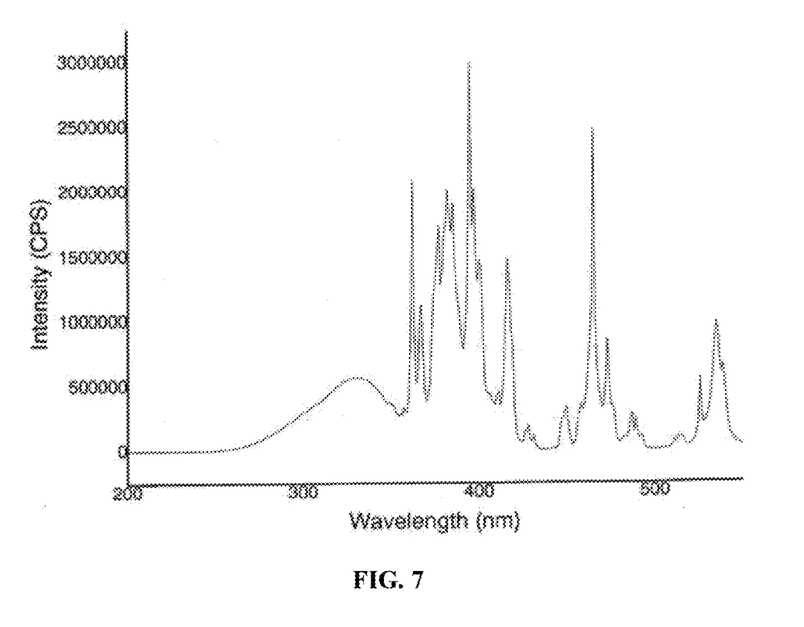
FIG. 7 illustrates an excitation spectrum of the $Li_{2.6}Eu_4(MoO_4)_{6.4}(BO_3)_{0.6}$ fluorescent material, $\lambda_{em}$=615 nm.

The test is carried out according to the method in the embodiment 1, and the 615 nm-emitting excitation spectrum of the red fluorescent material is as shown in FIG. 7. The physical meaning of the excitation spectrum in FIG. 7 is identical to that in FIG. 1, however, inhomogeneous broadening appears on the excitation spectrum lines of high 4 g energy levels, which dramatically enhances absorption for long-wave ultraviolet-visible blue/green light and also greatly improve excitation efficiency. Its 615 nm emissive power is 1.50 times as much as that in the embodiment 1.

Figure 8:
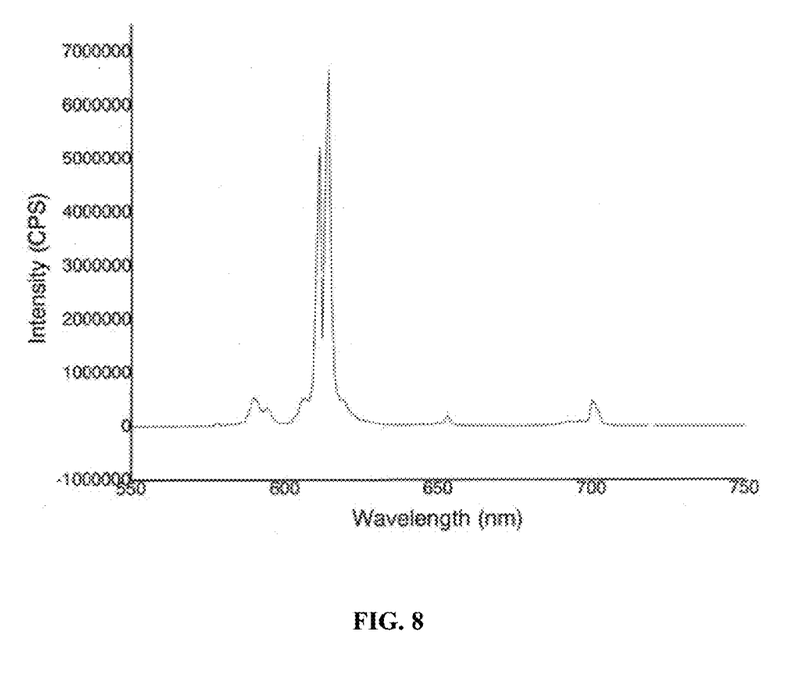
FIG. 8 illustrates an emission spectrum of the $Li_{2.6}Eu_4(MoO_4)_{6.4}(BO_3)_{0.6}$ fluorescent material, $\lambda_{ex}$=465 nm.
Figure 9:
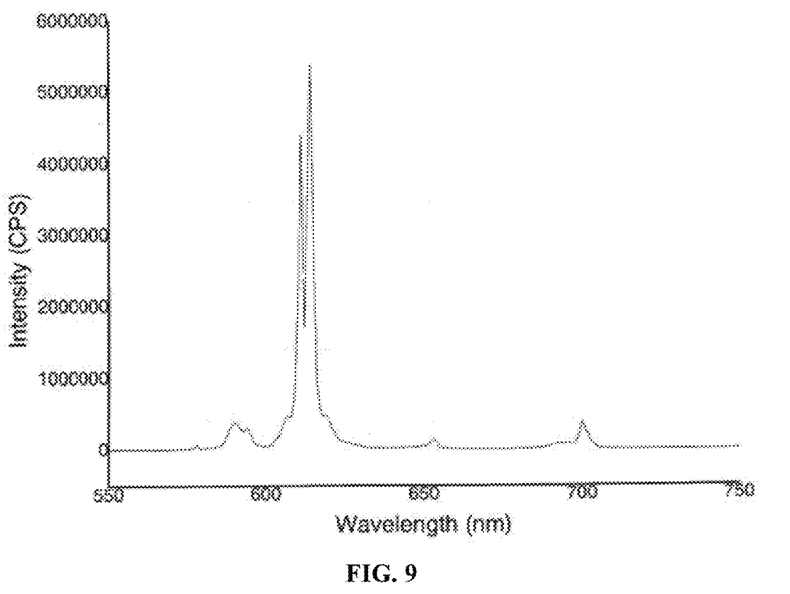
FIG. 9 illustrates an emission spectrum of the $Li_{1.5}Eu_4(MoO_4)_{6.5}F_{0.5}$ fluorescent material, $\lambda_{ex}$=465 nm.

Such a new red fluorescent material has an emission spectrum as shown in FIG. 8. Emission of most of the energies is centralized on $^5D_0 \rightarrow {}^7F_2$ energy level transition emission of $Eu^{3+}$ while the proportions of other energy level transition emissions are relatively small, as a result, the color purity is quite high. This fluorescent material emits strong red light under the illumination of 254 nm and 365 nm ultraviolet lamps.

Embodiment 6

$Li_{1.5}Eu_4(MoO_4)_{6.5}F_{0.5}$

0.140 g $Li_2CO_3$, 2.223 g $Eu_2O_3$, 3.000 g $MoO_3$ and 0.033 g LiF are weighed according to the method in the embodiment 1 and uniformly ground and mixed, the mixture is firstly pre-heated at 450° C. for 2 hours in a box-type high temperature furnace, then taken out and uniformly ground and mixed and put back in a previous crucible, the crucible is topped and put in the box-type high temperature furnace, the temperature is raised to 800° C. and kept for 2.5 hours, the mixture is taken out, impurity-removed by acid cleaning and finally dried to obtain a $Li_{1.5}Eu_4(MoO_4)_{6.5}F_{0.5}$ fluorescent material. This fluorescent material emits strong red light under the excitation of ultraviolet-visible blue/green light, and its emissive power is much larger than that of the corresponding molybdate red fluorescent material containing no fluorine. FIG. 8 illustrates an emission spectrum of the fluorescent material under the excitation of 465 nm blue light, and its spectrum lines and properties are the same as those in FIG. 4 and FIG. 8. Under the same test conditions, inhomogeneous broadening appears on the emission and excitation spectrum lines of the fluorine-containing sample, which is the same as the $Li_2Eu_4(MoO_4)_7$ sample containing no fluorine, the excitation efficiency is greatly raised, and the emissive power of the sample in the embodiment 6 is much larger than that of the $Y_2O_2S$:Eu red fluorescent material under the excitation of 395 nm and 465 nm.

Embodiment 7

$Li_{2.2}(Gd_{0.45}Eu_{0.50}Sm_{0.05})_4(MoO_4)_{6.8}(BO_3)_{0.2}$

0.249 g $Li_2CO_3$, 1.000 g $Gd_2O_3$, 1.079 g $Eu_2O_3$, 0.107 g $Sm_2O_3$, 3.000 g $MoO_3$ and 0.038 g $H_3BO_3$ are weighed and uniformly grounded and mixed, the mixture is put in a crucible, the crucible is put in a box-type high-temperature furnace and preheated for 1 hour at 550° C., then the mixture is burned for 2 hours after the temperature is raised to 800° C., the resultant product is crushed, impurity-removed by water cleaning and dried to obtain a $Li_{2.2}(Gd_{0.45}Eu_{0.50}Sm_{0.05})(MoO_4)_{6.8}(BO_3)_{0.2}$ red fluorescent material, which emits quite strong red light under the excitation of near ultraviolet light from 400 nm to 410 nm, this is because $Eu^{3+}$ and $Sm^{3+}$ can be excited at the same time. Compared with the embodiment 1, the red fluorescent material obtained in this embodiment can be better matched with near ultraviolet light emitted by an InGaN chip.

Embodiment 8

$Li_2(Gd_{0.7}Bi_{0.1}Eu_{0.2})_4(MoO_4)_7$

Corresponding $Li_2O$, $Gd_2O_3$, $Bi_2O_3$, $Eu_2O_3$ and $MoO_3$ are weighed stoichiometrically and then used for preparing a $Li_2(Gd_{1-x}Eu_xBi_{0.1})_4(MoO_4)_7$ red fluorescent material according to the method in the embodiment 1, wherein the burning and synthesis temperatures can be regulated within a certain range in combination with $Bi_2O_3$ concentration, for example, $Li_2(Gd_{0.7}Bi_{0.1}Eu_{0.2})_4(MoO_4)_7$ can be prepared by burning for 3 hours at 770° C. The excitation luminous intensity of NUV blue light is low due to low $Eu^{3+}$ concentration in $Li_2(Gd_{0.7}Bi_{0.1}Eu_{0.2})_4(MoO_4)_7$, but strong red light can be emitted under the excitation of a 365 nm lamp.

Embodiment 9

$Li_2(La_{1-x}Eu_x)_4(MoO_4)_4$

Corresponding $Li_2O$, $La_2O_3$, $Eu_2O_3$ and $MoO_3$ are weighed stoichiometrically and then used for preparing a $Li_2(La_{1-x}Eu_x)_4(MoO_4)_4$ red fluorescent material according to the method in the embodiment 1, and the resultant red fluorescent material emits red light under the excitation of ultraviolet light-blue light.

Embodiment 10

$Li_2(Y_{1-x}Eu_x)_4(MoO_4)_4$

Corresponding $Li_2CO_3$, $Y_2O_3$, $Eu_2O_3$ and $MoO_3$ are weighed stoichiometrically and then used for preparing a $Li_2(La_{1-x}Eu_x)_4(MoO_4)_4$ red fluorescent material according to the method in the embodiment 1, and the resultant red fluorescent material emits red light under the excitation of ultraviolet light-blue light.

Embodiment 11

$Li_2(Gd_{0.5}Eu_{0.5})_4(MoO_4)_4(WO_4)_3$

0.257 g $Li_2CO_3$, 1.259 g $Gd_2O_3$, 1.222 g $Eu_2O_3$, 2.000 g $MoO_3$ and 2.417 g $WO_3$ are weighed and used for preparing a $Li_2(Gd_{0.5}Eu_{0.5})_4(MoO_4)_4(WO_4)_3$ red fluorescent material according to the method in the embodiment 1, and the red fluorescent material emits, under the excitation of blue light or near ultraviolet light, red light having higher emissive power than the sample in the embodiment 1.

Embodiment 12

$Li_{0.2}Ca_4(Gd_{0.2}Eu_{0.8})_2(MoO_4)_{6.8}(BO_3)_{0.2}$

Corresponding $Li_2O$, $CaCO_3$, $Gd_2O_3$, $Eu_2O_3$, $MoO_3$ and $H_3BO_3$ are weighed based on the stoichiometric proportions of $Li_{0.2}Ca_4(Gd_{0.2}Eu_{0.8})_2(MoO_4)_{6.8}(BO_3)_{0.2}$ and then used for preparing a red fluorescent material $Li_{0.2}Ca_4(Gd_{0.2}Eu_{0.8})_2(MoO_4)_{6.8}(BO_3)_{0.2}$ according to the method in the embodiment 1, wherein the burning temperature can be raised to 960° C., burning is carried out for 2 hours, and the red fluorescent material emits red light under the excitation of ultraviolet light and blue light.

Embodiment 13

$Li_{2.2}Eu_4(MoO_4)_{6.8}(BO_3)_{0.2}$

Figure 10:
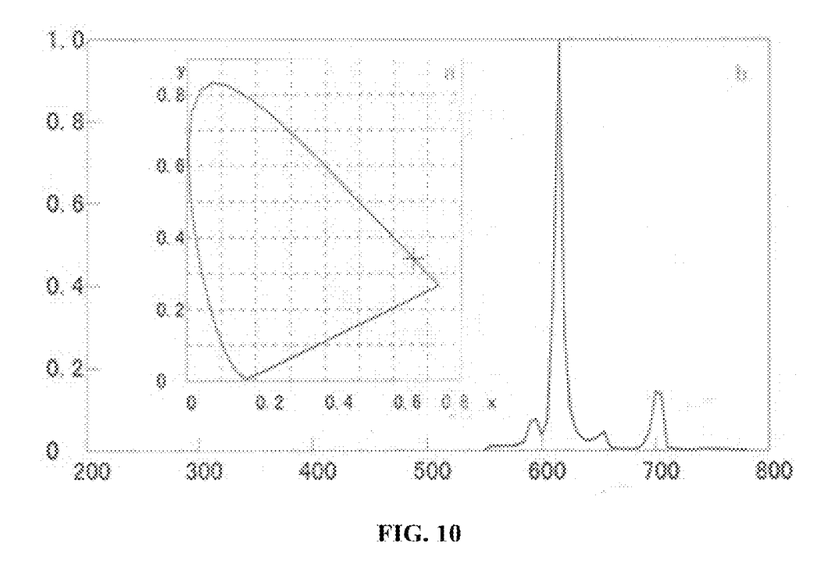
FIG. 10 illustrates an emission spectrum of the $Li_{2.2}Eu_4(MoO_4)_{6.8}(BO_3)_{0.2}$ fluorescent material under the excitation of 408 nm LED (a) and chromaticity coordinate x, y values in 1931CIE chromaticity diagram (b).

According to the method in the embodiment 1, when the prepared $Li_{2.2}Eu_4(MoO_4)_{6.8}(BO_3)_{0.2}$ molybdate red fluorescent material is under the excitation of an LED that emits near ultraviolet light near 408 nm under forward current 20 mA, x and y values in the emission spectrum chromaticity coordinate of the fluorescent material is recorded by an SPR-920 type spectra radiance analysis instrument. The results are as shown in FIG. 10. In the chromaticity coordinate, x=0.660 and y=0.340. The emission peak λ=615 nm. Therefore, the fluorescent powder can be used as the red component in LED three primary colors of NUV.

Discussed above is further detailed descriptions made to the invention with reference to the preferred embodiments, and it shall not be considered that the embodiments of the invention are limited to these descriptions only. Many simple deductions or alternations could also be made without departing from the concept of the invention by those ordinary skilled in this art to which the invention pertains, and shall be contemplated as being within the scope of the invention.

What is claimed is:

1. A red fluorescent material, wherein the chemical formula of the red fluorescent material is:

$M^I$ is one or more of the group consisting of Ag, Na, K, Rb and Cs;

$M^{II}$ is one or more of the group consisting of Be, Mg, Ca, Sr, Ba, Zn, Mn, Pb, Cd and Cu;

Ln is one or more of the group consisting of Bi, Al, Ga, In, Sc, Y, La, Ce, Pr, Nd, Sm, Tb, Dy, Ho, Er, Tm, Yb and Lu;

A is a group formed by bonding of oxygen with one or more of the group consisting of B, Si, Ge, Ti, Zr, Hf, V, Nb, Ta and P or a halogen anion;

$0 \leq a \leq 1$, $0 \leq b \leq 1$, $0 \leq a+b \leq 1$, $0 \leq c \leq 7$, $0 \leq z \leq 2$, $0 \leq c+z \leq 7$, $0 < x \leq 1$, $0 \leq y \leq 0.5$, $0 < x+y \leq 1$, and m=z when A is the group formed by bonding of oxygen with one or more of the group consisting of B, Si, Ge, Ti, Zr, Hf, V, Nb, Ta and P; and m=−z when A is the halogen anion.

2. The red fluorescent material according to claim 1, wherein A is $(BO_3)^{3-}$ or a halogen anion.

3. The red fluorescent material according to claim 1, wherein $0.3 \leq x \leq 1.0$.

4. The red fluorescent material according to claim 1, wherein a=0.

5. A preparation method of the red fluorescent material of claim 1, wherein the method comprises the steps of:
1) taking metals or compounds of Li, Mo and W and compounds of Eu, Gd, $M^I$, $M^{II}$, Ln and A as raw materials, weighing corresponding raw materials in accordance with the molar mixture ratio as required by the chemical formula of claim 1, and grinding and uniformly mixing the raw materials to obtain a mixture; and
2) burning the mixture for 0.5 to 10 hours at 750-1000° C. to obtain the red fluorescent material.

6. The preparation method of the red fluorescent material according to claim 5, wherein distilled water and/or volatile organic solvent is added in the grinding process of the step 1), and the volatile organic solvent is one or the mixture of acetone and ethanol.

7. The preparation method of the red fluorescent material according to claim 5, wherein an extra post-treatment process is carried out subsequent to the step 2), and includes crushing, impurity removal, drying and classification, and the impurity removal process includes one or more of the group consisting of acid cleaning, alkaline cleaning and water cleaning.

8. The preparation method of the red fluorescent material according to claim 5, wherein a pre-burning step is carried out before step 2) and the pre-burning step is that the mixture obtained from step 1) is pre-burned for 0.5 to 3 hours in the air and then ground and uniformly mixed.

9. The preparation method of the red fluorescent material according to claim 8, wherein the burning time in the step 2) is 1.5 to 4 hours.

10. An LED light source, wherein the LED light source includes the red fluorescent material according to claim 1.

11. A preparation method of the LED light source of claim 10, wherein the red fluorescent material according to claim 1 is mixed with blue and green fluorescent materials that can be excited by 370-410 nm near ultraviolet light, then the mixture is combined with package resin and coated on a semiconductor chip capable of emitting near ultraviolet light, to obtain a white LED electric light source.

12. A preparation method of the LED light source of claim 10, wherein the red fluorescent material according to claim 1 is mixed with yellow and/or yellow-green fluorescent material that can be excited by blue light, then the mixture is combined with package resin and coated on an LED chip capable of emitting 460-470 nm blue light, to obtain a white LED electric light source.

13. The preparation method of the LED light source according to claim 12, wherein the LED chip is an LED chip that emits 464-467 nm blue light.

* * * * *